(12) United States Patent
Ahmad

(10) Patent No.: US 6,703,260 B2
(45) Date of Patent: *Mar. 9, 2004

(54) LEADFRAMES INCLUDING OFFSETS EXTENDING FROM A MAJOR PLANE THEREOF, PACKAGED SEMICONDUCTOR DEVICES INCLUDING SAME, AND METHODS OF DESIGNING AND FABRICATING SUCH LEADFRAMES

(75) Inventor: Syed Sajid Ahmad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/334,234

(22) Filed: Dec. 30, 2002

(65) Prior Publication Data

US 2003/0104656 A1 Jun. 5, 2003

Related U.S. Application Data

(60) Continuation of application No. 09/942,182, filed on Aug. 29, 2001, now Pat. No. 6,500,697, which is a continuation of application No. 09/649,247, filed on Aug. 28, 2000, now Pat. No. 6,331,448, which is a division of application No. 09/082,105, filed on May 20, 1998, now Pat. No. 6,329,705.

(51) Int. Cl.$^7$ ................................................ H01L 21/44
(52) U.S. Cl. .................... 438/112; 438/123; 438/124; 438/127
(58) Field of Search ........................ 438/111, 112, 438/121, 122, 123, 124; 257/667, 676

(56) References Cited

U.S. PATENT DOCUMENTS

| | | |
|---|---|---|
| 4,523,218 A | 6/1985 | Kato |
| 4,987,473 A | 1/1991 | Johnson |
| 4,994,895 A | 2/1991 | Matsuzaki et al. |
| 5,197,183 A | 3/1993 | Chia et al. |
| 5,223,739 A | 6/1993 | Katsumata et al. |
| 5,252,783 A | 10/1993 | Baird |
| 5,291,059 A | 3/1994 | Ishitsuka et al. |
| 5,291,061 A | 3/1994 | Ball |
| 5,345,106 A | 9/1994 | Doering et al. |
| 5,357,674 A | 10/1994 | Lumbard |
| 5,369,058 A | 11/1994 | Burns et al. |
| 5,530,281 A | 6/1996 | Groover et al. |
| 5,543,658 A | 8/1996 | Hosokawa et al. |
| 5,570,272 A | 10/1996 | Variot |
| 5,581,121 A | 12/1996 | Burns et al. |
| 5,594,234 A | 1/1997 | Carter, Jr. et al. |
| 5,644,161 A | 7/1997 | Burns |
| 5,692,296 A | 12/1997 | Variot |
| 5,736,432 A | 4/1998 | Mackessy |
| 5,783,861 A | 7/1998 | Son |
| 5,866,939 A | 2/1999 | Shin et al. |
| 5,905,301 A | 5/1999 | Ichikawa et al. |
| 5,910,681 A | 6/1999 | Kozono |
| 5,932,923 A | 8/1999 | Kim et al. |
| 6,028,368 A | 2/2000 | Abe |
| 6,331,448 B1 * | 12/2001 | Ahmad ............... 438/112 |
| 6,500,697 B2 * | 12/2002 | Ahmad ............... 438/112 |

FOREIGN PATENT DOCUMENTS

| | | |
|---|---|---|
| JP | 59-103364 | 6/1984 |
| JP | 59-103365 | 6/1984 |

* cited by examiner

Primary Examiner—Kevin M. Picardat
(74) Attorney, Agent, or Firm—TraskBritt

(57) ABSTRACT

A leadframe including offsets extending from a major plane thereof. The offsets extend from the major plane at a non-perpendicular angle thereto. Preferably, the angle of extension, relative to the major plane, is about 45 degrees or less. The offsets may extend upwardly and/or downwardly from the major plane. The offsets of the present invention are useful for preventing warpage, bowing, skewing, or other distortions of a packaged semiconductor device including same when subjected to high temperatures or changes in temperature.

21 Claims, 5 Drawing Sheets

LEADFRAMES INCLUDING OFFSETS EXTENDING FROM A MAJOR PLANE THEREOF, PACKAGED SEMICONDUCTOR DEVICES INCLUDING SAME, AND METHODS OF DESIGNING AND FABRICATING SUCH LEADFRAMES

CROSS-REFERENCE TO RELATED APPLICATIONS

This application is a continuation of application Ser. No. 09/942,182, filed Aug. 29, 2001, now U.S. Pat. No. 6,500,697, issued Dec. 31, 2002, which is a continuation of application Ser. No. 09/649,247, filed Aug. 28, 2000, now U.S. Pat. No. 6,331,448 B1, issued Dec. 18, 2001, which is a divisional of application Ser. No. 09/082,105, filed May 20, 1998, now U.S. Pat. No. 6,329,705 B1, issued Dec. 11, 2001.

BACKGROUND OF THE INVENTION

1. Field of the Invention

The present invention relates to a leadframe which includes offsets that extend transversely from a major plane thereof. Particularly, the offsets of the leadframe extend from the leadframe at a non-perpendicular angle. More particularly, the offsets of the present invention reduce stress in the package by optimally positioning the die and, thus, prevent or reduce warpage, bending, or skewing of a packaged semiconductor device into which the offsets are incorporated.

2. Background of Related Art

With reference to FIG. 1, a conventional packaged semiconductor device 10 typically includes a semiconductor device 14, which is also referred to as a die, leads 26 operatively connected to the semiconductor device, and a filled-polymer packaging material 16, which is also typically referred to as an "encapsulant." Packaging material 16 defines a package 18 that surrounds at least a portion of each of semiconductor device 14 and its associated leads 26.

Various types of leadframes have been employed in the packaging of semiconductor devices. FIG. 1 illustrates an exemplary, conventional leadframe 20, which includes a die paddle 22, a tie bar 24, and a plurality of leads 26 extending at least partially outwardly toward a frame (not shown), or periphery, of leadframe 20. Typically, the leads 26 extend through the packaging material 16 of the packaged semiconductor device 10 and externally thereof in order to facilitate the establishment of an electrical connection between the leads and a carrier substrate such as a printed circuit board (PCB). Leadframes that do not include a die paddle, which are typically referred to as "paddle-less" leadframes, such as "leads-over-chip" (LOC) configured leadframes and "leads-under-chip" (LUC) configured leadframes, are also employed in conventional packaged semiconductor devices.

The tendency of a packaged semiconductor device to warp, bend, or skew when subjected to temperature changes or high temperatures, such as during the solidification of the molten packaging material following encapsulation or during the operation of the finished packaged semiconductor device, has long been a concern to designers and manufacturers of packaged semiconductor devices ("dice"). As the die, packaging material, leads and other packaged semiconductor device components undergo temperature changes or are subjected to high temperatures, the diverse coefficients of thermal expansion of these various components may cause the packaged semiconductor device of which they are a part to expand, warp, bend, skew, or otherwise distort. Typically, the higher the temperature to which the die, packaging material, leads and other packaged semiconductor device components are subjected, the greater the tendency toward warpage, bending, or other shape changes in the package. With the ever-increasing circuit densities and reduced sizes of state of the art semiconductor devices, the operating temperatures of many such devices are also ever-increasing. Thus, state of the art packaged semiconductor devices have an increased tendency for warpage, bending, skewing and other dimensional distortions.

Some packaged semiconductor devices include stiffening elements to counteract such warpage, bending, or skewing. Exemplary packaged semiconductor devices that include stiffening elements are disclosed in U.S. Pat. No. 5,644,161 (the "'161 patent"), which issued to Carmen D. Burns on Jul. 1, 1997, and U.S. Pat. No. 5,369,058 (the "'058 patent"), which issued to Carmen D. Burns et al. on Nov. 29, 1994. The stiffening elements of the '161 and '058 patents are warp-resistant metal layers that are disposed proximate both of the major surfaces of the semiconductor device and are substantially coextensive with the major surfaces. Such stiffening elements are, however, somewhat undesirable from the standpoint that they are separate from the leadframe and, therefore, additional assembly steps are required during packaging of the semiconductor device. Thus, packaging costs and the likelihood of damaging the semiconductor device during packaging are increased. Since these stiffening elements are additional to the leadframe, they may also undesirably increase the size of the packaged semiconductor device. Moreover, the stiffening elements of the '161 and '058 patents are substantially parallel to the major plane of the leadframe of the packaged semiconductor device, and thus are not likely to provide any added heat sink properties to the packaged semiconductor device. Therefore, these stiffening elements do not counteract warpage, bending, or skewing of the packaged semiconductor device in directions that are substantially parallel to a plane in which a substantial portion of the leadframe is located.

During many conventional packaging processes, such as transfer molding and injection molding processes, a semiconductor device may be displaced within a cavity of a mold and the leads bent or disassociated from the semiconductor device by the hydraulic forces of the molten packaging material during its introduction into the mold cavity. Thus, the orientation of the semiconductor device relative to the exterior surface of the package may be altered. Such displacement of the semiconductor device may force the semiconductor device against an inner surface of the cavity, which could damage the semiconductor device or, at the least, compromise the integrity of the package. Non-optimal positioning of a semiconductor device within a package also changes the designed balance of the package, which causes residual stresses within the package.

U.S. Pat. Nos. 5,570,272 (the "'272 patent"), which issued to Patrick Variot on Oct. 29, 1996, and 5,692,296 (the "'296 patent"), which issued to Patrick Variot on Dec. 2, 1997, each disclose a leadframe that has been configured to counteract displacement of the leadframe-semiconductor device assembly within a mold during the introduction of a packaging material into the cavity thereof and which includes a heat sink that is exposed to an outer surface of the package. The leadframe of the '272 and '296 patents includes tie bars that extend perpendicularly upward relative to the plane of the leadframe a sufficient distance that, when placed within a cavity of a mold, the tie bars will force a heat sink that is disposed beneath the leadframe into contact with an inner surface of the cavity. As the leadframe is positioned within a cavity of a mold, the tie bars abut an inner surface of the cavity and force the leadframe and heat sink against an opposite inner surface of the cavity in order to secure the leadframe within the cavity. Thus, as molten packaging material is introduced into the cavity, the perpendicularly extending tie bars resist any tendency of the hydraulic force of the molten packaging material to "lift" the assembly in the mold cavity, holding the leadframe and the semiconductor device carried thereon in place as the packaging material is introduced into the cavity, and preventing packaging material from covering the bottom surface of the heat sink.

The perpendicularly extending tie bars of the leadframe of the '272 and '296 patents are, however, somewhat undesirable because, as a mold is closed around that leadframe, the tie bar extensions contact the inner surface of the mold cavity, and may exert force thereagainst, which may scratch or otherwise damage the wall surfaces of the cavity. Damaging the interior surfaces of the mold cavity may cause aesthetic changes to the finished packaged semiconductor device, may hinder release of the package from the mold, and may adversely affect the ability of conventional transfer equipment to properly handle the packaged semiconductor device during subsequent assembly or testing steps, which may cause such equipment to drop or otherwise mishandle the packaged semiconductor device, and thereby increase failure rates. Furthermore, since the tie bars extend perpendicularly from the leadframe, as force is applied to an end of one of the tie bars, the tie bar may flex or bend unpredictably under the longitudinal loading and displace the semiconductor device within the cavity. As noted previously, such displacement of the leadframe within the cavity offsets the leadframe within the finished packaged semiconductor device, which may affect the dimensions, the mechanical balance, and the mechanical and electrical reliability of the packaged semiconductor device. When the packaging material hardens, if these tie bars have been previously flexed under force of the closed mold, upon release of the package from the mold, the tie bars may exert force on the packaging material, which may cause bowing, warpage, bending, or skewing of the packaged semiconductor device, or cause the packaging material to crack or otherwise separate.

The leadframe that is disclosed in the '272 and '296 patents is further undesirable since the perpendicularly extending offsets thereof prevent compact stacking of such leadframes for storage. Thus, these leadframes consume excessive space in storage and in the equipment that feeds these leadframes into molding equipment relative to the amount of space consumed by conventional leadframes that may be compactly stacked.

Thus, a leadframe is needed that resists warpage, bending, skewing and other distortions when incorporated into a packaged semiconductor device, and which prevents displacement of an associated semiconductor device within a mold cavity during packaging processes without damaging interior surfaces of a mold cavity. There is a further need for a leadframe that may be stacked and stored in a relatively compact manner.

BRIEF SUMMARY OF THE INVENTION

A leadframe of the present invention may be of a conventional, LOC, LUC, or any other leadframe configuration that is employed in the art. The leadframe according to the present invention includes a plurality of leads extending inwardly therefrom. The leadframe of the present invention also includes a plurality of offsets that extend transversely and non-perpendicularly therefrom relative to a plane upon which a substantial portion of a die mounting region of the leadframe lies, which may be characterized as the "major plane" of the leadframe. The offsets preferably extend from the leadframe at an angle of about 45 degrees or less to this major plane.

In a first variation of the leadframe of the present invention, each of the offsets extends from the same side of the leadframe. In a second variation, offsets extend from both sides of the leadframe. Offsets may be specially added to the leadframe to extend from any portion thereof, or may be incorporated into the structure of an existing element of the leadframe, such as a lead, tie bar, bus bar, or die paddle thereof.

Accordingly, the present invention also includes methods of designing a leadframe with one or more offsets. In designing the leadframe of the present invention, various factors may be considered in determining the number, location, direction of extension and length of the offsets. Such factors include, without limitation, the predicted warpage tendencies of the particular package-leadframe-semiconductor device combination and the desired manner in which packaging material enters and fills a cavity of a mold to surround the leadframe-semiconductor device assembly disposed within the mold cavity.

A method of packaging a semiconductor device in association with the leadframe of the present invention includes operatively attaching the semiconductor device to the leadframe, and positioning the leadframe-semiconductor device assembly in a cavity of a mold, such that selected ones of the offsets abut or are proximate an interior surface of the cavity. As a molten packaging material is injected into the mold cavity, the offsets resist the force of the flow of the molten packaging material traversing the cavity in order to maintain the position of the leadframe relative to the cavity.

Packaged semiconductor devices that are formed in accordance with the method of packaging are also within the scope of the present invention. The packaged semiconductor device includes the leads and offsets of the inventive leadframe, a semiconductor device operatively attached to the leads, and a molded package disposed about at least a portion of the leadframe-semiconductor device assembly. The offsets extend substantially through the package from the leadframe major plane to a location proximate an exterior surface thereof. An offset may also extend to the exterior of the package such that a portion of the offset is flush with an edge thereof exposed to the package exterior.

Other advantages of the present invention will become apparent to those of ordinary skill in the relevant art through a consideration of the appended drawings and the ensuing description.

DETAILED DESCRIPTION OF THE INVENTION

Figure 2:
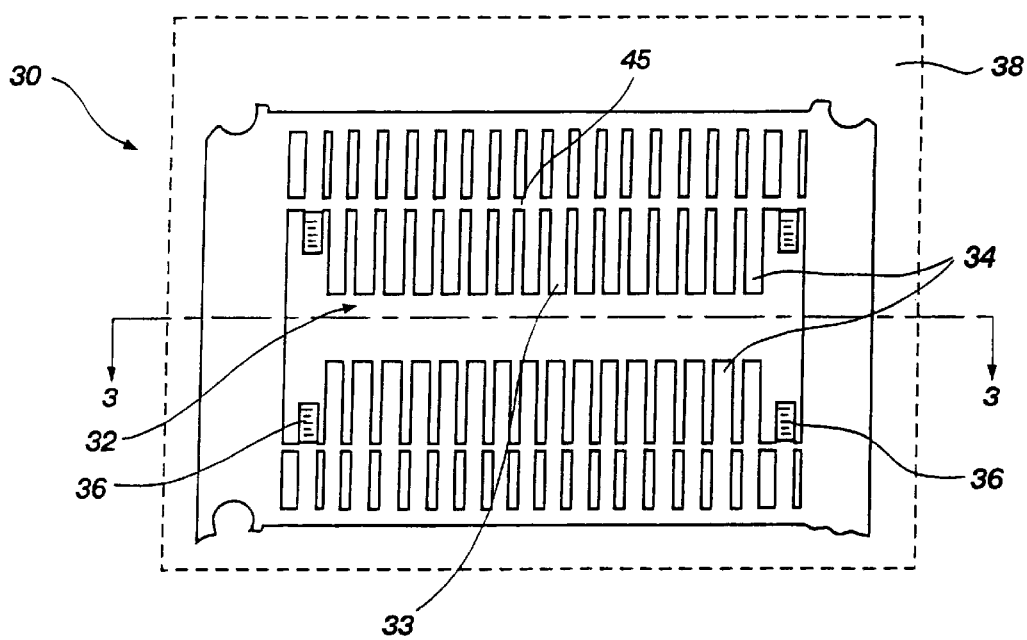
FIG. 2 is a top plan view of an embodiment of a leadframe according to the present invention, including offsets extending from the bottom surface thereof.

With reference to FIG. 2, a first embodiment of a leadframe 30 according to the present invention includes a plurality of leads 34 that extends laterally outward from a die mounting region 32 thereof. Leadframe 30 also includes a plurality of offsets 36 that extends transversely relative to the plane of die mounting region 32 of the leadframe, at an angle that is non-perpendicular to the die mounting region. Preferably, offsets extend from leadframe 30 at an angle of about 45 degrees or less.

Figure 1:
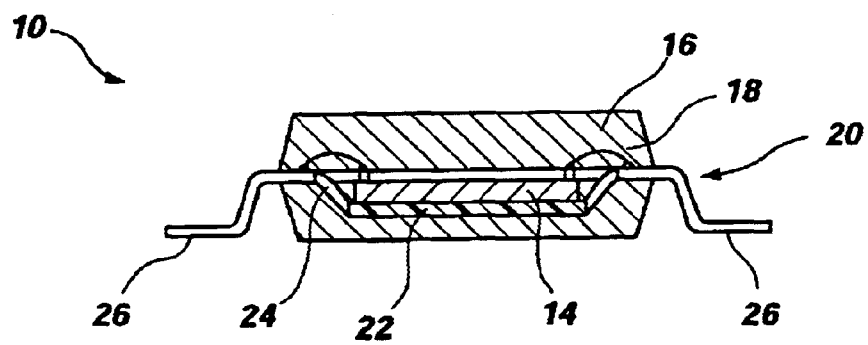
FIG. 1 is a cross-sectional view of a conventional packaged semiconductor device.
Figure 3:
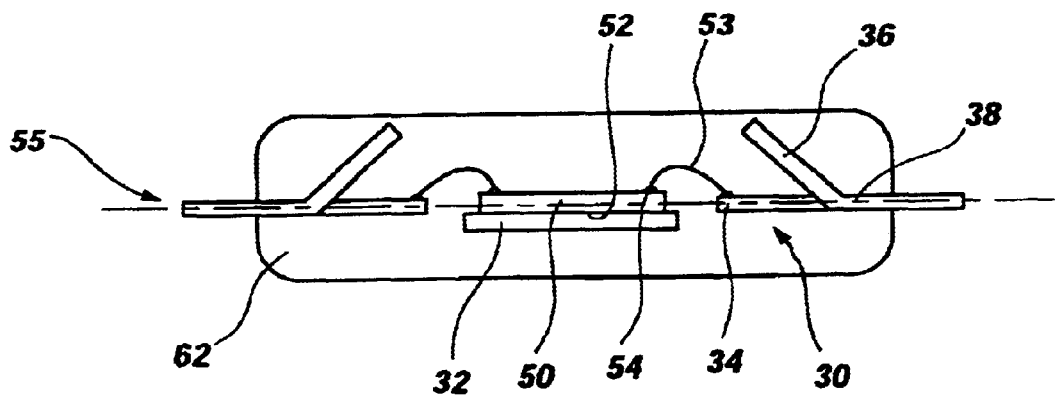
FIG. 3 is a cross-section taken along line 3—3 of FIG. 2, which also illustrates a die disposed upon the leadframe and a package surrounding at least a portion of each of the leadframe and die.
Figure 4:
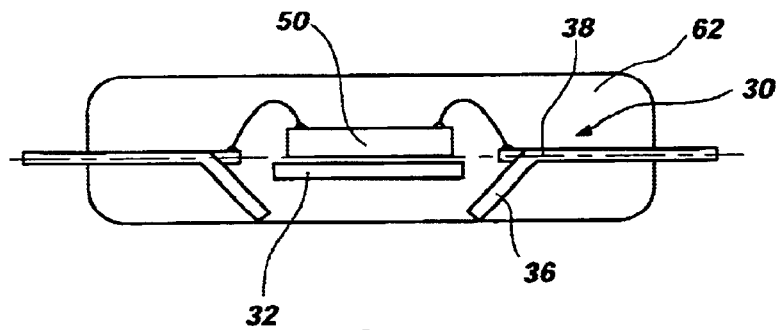
FIGS. 4 and 5 are cross-sectional views of variations of the leadframe of FIGS. 2 and 3, which include offsets extending from the top surface thereof and from both the top and bottom surfaces thereof, respectively.
Figure 5:
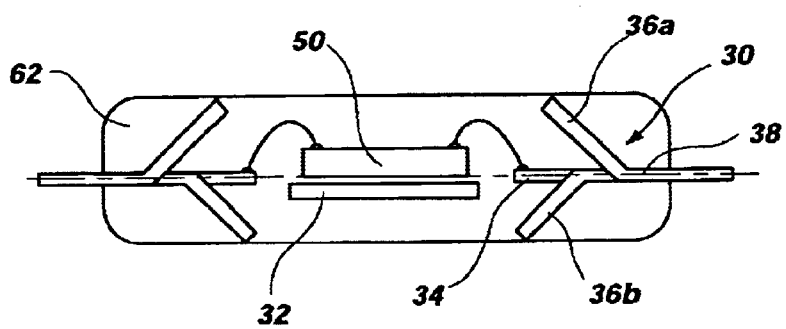

As depicted in FIGS. 2 and 3, each of offsets 36 extends upwardly, from major plane 38 of leadframe 30, and is positioned adjacent one or more leads 34. Referring to FIG. 4, in a variation of leadframe 30, each of offsets 36 extends downwardly from major plane 38. FIG. 5 illustrates another variation of leadframe 30, wherein a first group of offsets 36a extends upwardly from the major plane 38, and a second group of offsets 36b extends downwardly from major plane 40.

Although FIGS. 2 through 5 illustrate offsets 36 that are adjacent to leads 34, offsets 36 may extend transversely from another portion of leadframe 30, such as the die paddle, tie bars, bus bars, or lateral extensions of any of the foregoing.

FIGS. 2 through 5 illustrate a "leads-over-chip" (LOC) leadframe 30 that includes a die mounting region 32 to which a surface 52 of a semiconductor device 50 (see FIG. 3), which is also referred to as a die, is attached. Alternatively, leadframe 30 may have a conventional configuration (i.e., with a die paddle upon which a semiconductor device 50 may be disposed), a "leads-under-chip" (LUC) configuration, or any other type of leadframe configuration known in the art. Selected leads 34 are electrically connected to corresponding bond pads 54 of semiconductor device 50 by techniques that are known in the art, including, without limitation, by wire bonding, TAB bonding, z-axis conductive elastomer, solder, or conductive epoxy (see FIG. 3).

With continued reference to FIG. 2, a method of designing a leadframe 30 according to the present invention includes configuring a plurality of leads 34 in a desired pattern, configuring a die mounting region 32 adjacent a die connect end 33 of the leads, and configuring a plurality of offsets 36 that extend from major plane 38 of leadframe 30.

Figure 2A:
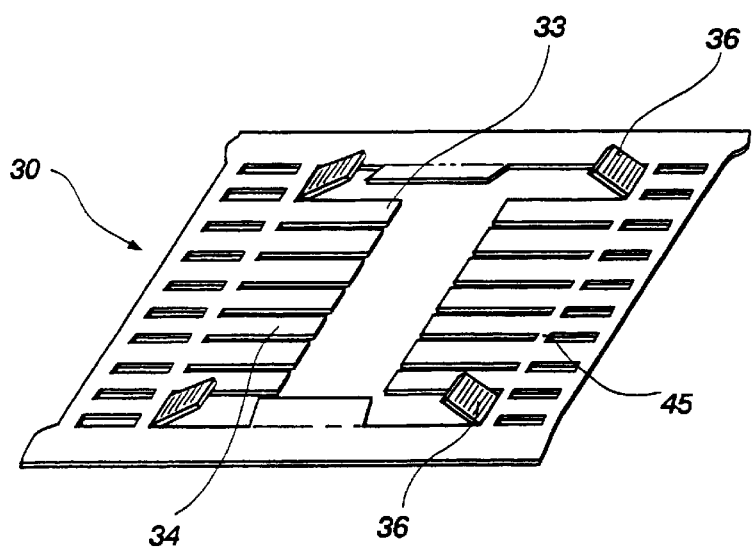
FIG. 2a is a perspective view of a variation of the leadframe of FIG. 2.
Figure 6A:
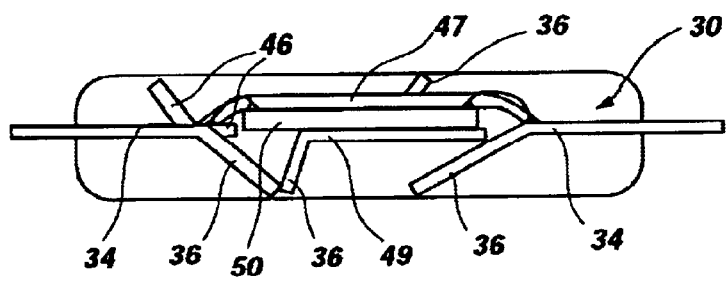
FIG. 6a is a cross-sectional view of another variation of the leadframe of FIGS. 2 and 3, wherein conventional leadframe elements are bent to define the offsets.

Leadframe 30 may be a modification of an existing leadframe design, wherein offsets 36 are formed of excess material and are configured to extend transversely, adjacent an existing element of the leadframe, such as the leads 34, a tie bar, bus bar, or die paddle. Alternatively, with reference to FIG. 6a, an element or a portion of an element of leadframe 30, such as lead 34, bus bar 46, or die paddle 49, may be bent in a desired direction and at a desired angle to define offset 36. In another variation, shown in FIG. 2a, leadframe 30 may be of a unique design wherein offsets 36 are designed as separate elements of the leadframe.

Figure 7:
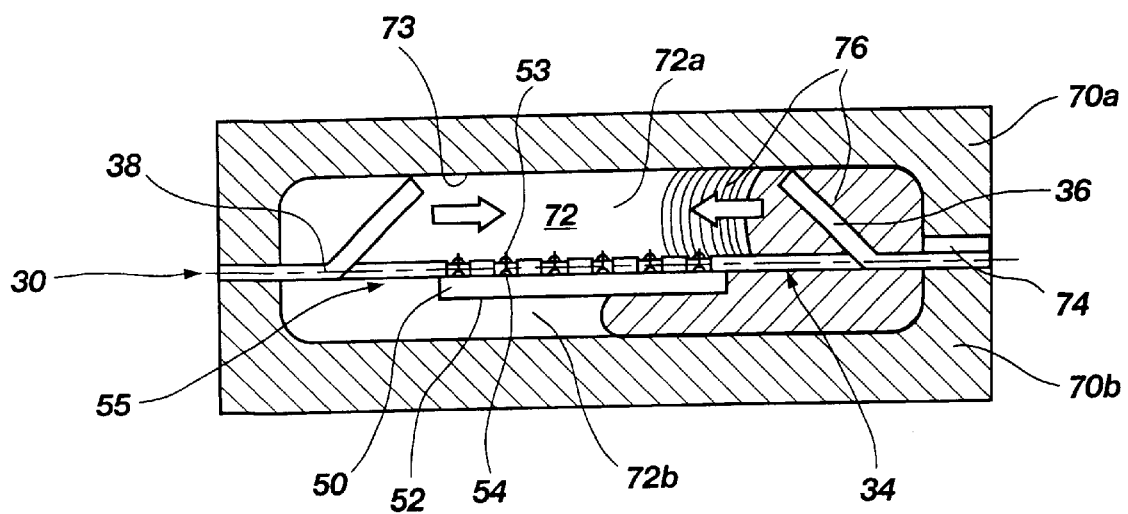
FIG. 7 is a cross-sectional view illustrating the leadframe of FIG. 5 disposed within a cavity of a mold.

Referring to FIG. 7, offsets 36 may be configured to extend from leadframe 30 at a distance and in a direction which will maintain the position of semiconductor device 50 within the cavity during the introduction of a packaging material 76 into the cavity. Thus, the number and positioning of offsets 36 of leadframe 30 depend, in part, upon the desired manner of introducing packaging material 76 into cavity 72. Configuring offsets 36 to extend proximate the periphery (i.e., sides and ends) of leadframe 30 and, therefore, proximate the peripheral surfaces of cavity 72 as mold 70, which has two halves 70a and 70b, is closed around leadframe-semiconductor device assembly 55, may balance the forces that the interior surface of the mold cavity and packaging material 76 that is introduced into cavity 72 each exert against the leadframe.

With continued reference to FIG. 7, in configuring the length of offsets 36 and the direction in which offsets 36 will extend, various other factors must also be considered, including, without limitation, the dimensions and tolerances of cavity 72 of mold 70 into which leadframe 30 will be positioned for packaging or encapsulation. Preferably, the length and direction in which offsets 36 are configured to extend will reduce the likelihood of causing damage to cavity 72 as mold 70 is closed over the leadframe-semiconductor device assembly 55. Offsets 36 may also be configured to deflect in response to the force of the inner surfaces of cavity 72 thereagainst, which may facilitate the proper orientation of semiconductor device 50 relative to the cavity and may reduce or eliminate stress in the packaged semiconductor device that is formed upon the introduction of packaging material 76 into the cavity.

Offsets 36 may also be configured to counteract predictable bending or warpage of a packaged semiconductor device, or otherwise minimize internal stresses in the package. This may be done by configuring offsets 36 so that their position, length and direction of extension counteract the tendency of a packaged semiconductor device including offsets 36 to warp or bend, or to eliminate other internal stresses within the packaged semiconductor device that may occur as the temperature of the packaged semiconductor device changes and that are caused by the different coefficients of thermal expansion of the various components of the packaged semiconductor device.

Figure 8:
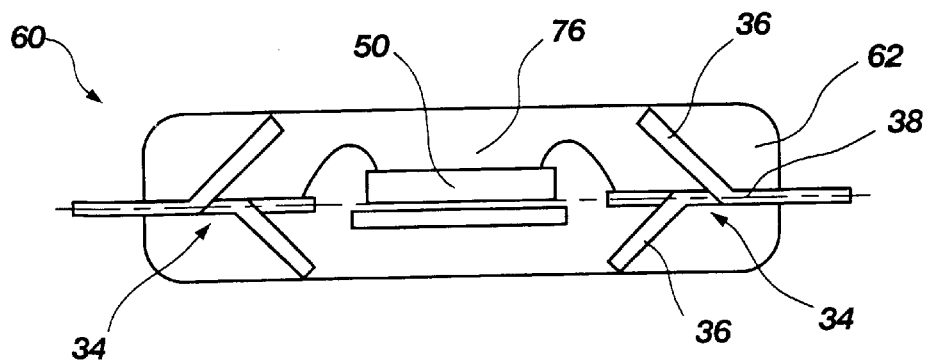
FIG. 8 is a cross-sectional view of a packaged semiconductor device according to the present invention, wherein the offsets extend flush with an exterior surface of the package, and illustrating the predictable direction in which the offsets will flex if they contact the surface of the cavity as the mold is closed.

Referring to FIG. 8, offsets 36 may be configured to extend flush with the outer surface of package 62 such that an edge of at least one offset 36 is exposed through an exterior surface of package 62. Offsets 36 that extend from a semiconductor device 50 to a position proximate the exterior surface of package 62 may facilitate the dissipation of heat from die 50 and package 62. Additional heat may be dissipated from package 62 by contacting offsets 36 to an external heat spreader.

Figure 6B:
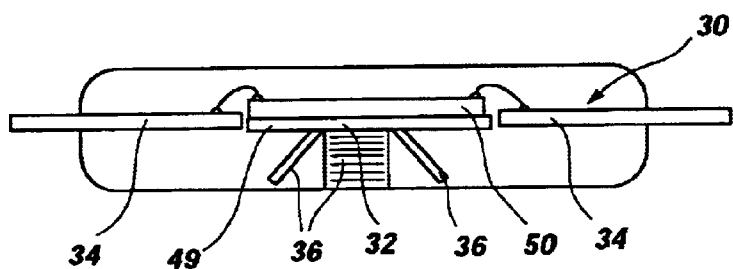
FIG. 6b is a cross-sectional view of yet another variation of the leadframe of FIGS. 2 and 3, wherein the die paddle has four offsets extending therefrom in a cruciform configuration.

Referring again to FIG. 2, leadframe 30 may be fabricated from materials that are known in the art, such as copper (Cu), copper alloys, nickel (Ni), iron-nickel (Fe—Ni) alloys, Alloy 42, or other electrically conductive materials. Similarly, leadframe 30 may be manufactured by processes that are known in the art, which typically include stamping or etching the leadframe material into the desired pattern. The leadframe may then be plated, deburred, or trimmed, as known in the art, in order to impart same with desired characteristics. Offsets 36 may be bent in a desired direction and to a desired angle as known in the art, such as during stamping of the leadframe or by another deformation operation subsequent thereto. Similarly, other components of leadframe 30, such as leads 34, tie bars 45 (see FIGS. 2 and 2*a*), bus bars 47 or the die paddle 49, may be bent as known in the art (see FIGS. 6*a* and 6*b*). FIG. 6*b* illustrates a die paddle 49 which includes offsets 36 extending therefrom in a cruciform configuration.

Referring again to FIG. 3, the bond pads 54 of semiconductor device 50 may be operatively connected with corresponding leads 34 of leadframe 30 by techniques that are known in the art, including, but not limited to, wirebonds, TAB bonds, z-axis elastomer, solder, conductive epoxy, and other electrically conductive connections. The operative connection of leadframe 30 to semiconductor device 50 forms a leadframe-semiconductor device assembly 55.

Turning again to FIG. 7, leadframe 30 may be packaged in accordance with a packaging process of the present invention, which includes placing the leadframe within cavity 72 of mold 70 and injecting molten packaging material 76 into the cavity under pressure. As illustrated, mold 70 includes two halves 70*a* and 70*b*, each of which define a cavity half 72*a* and 72*b*. Leadframe 30 is positioned over cavity half 72*a*, 72*b* of a mold half 70*a*, 70*b*, respectively. As mold halves 70*a* and 70*b* are closed upon one another, leadframe 30 and an outer portion of leads 34 lie outside of cavity 72 and between mold halves 70*a* and 70*b* while the remainder of leads 34, offsets 36, and other elements of leadframe 30 are enclosed within cavity 72. Offsets 36 facilitate maintenance of the proper orientation of semiconductor device 50 relative to cavity 72 as molten packaging material 76 is introduced into cavity 72 through a gate 74 that is formed through mold 70, and is continuous with cavity 72. Molten packaging material 76 may be introduced by techniques that are known and used in the art, including, without limitation, transfer molding techniques, injection molding techniques and casting. Similarly, offsets 36 may be positioned to effect the flow of molten packaging material 76 into cavity 72 in a manner which reduces the force of the flowfront and the hydraulic force of the packaging material against certain portions of leadframe-semiconductor device assembly 55, such as the semiconductor device 50 and any wire bonds 53 or other electrical connections between each bond pad 54 and its corresponding lead 34.

As noted previously, if not trimmed adequately, when enclosed within a mold cavity, the perpendicularly extending offsets of some conventional leadframes will be forced directly against the inner surface of the cavity of a mold. The force of conventional, perpendicularly extending offsets against the inner surface of the cavity will cause the offsets to bend unpredictably and may cause the offsets to buckle, which may alter the orientation of the semiconductor device within the cavity and, therefore, within the package, and may also damage the surface of the cavity.

Referring again to FIG. 7, the non-perpendicularly extending offsets 36 of the leadframe 30 of the present invention reduce or eliminate the likelihood that an inner surface 73 of cavity 72 of mold 70 will be damaged when the offsets 36, leads 34, semiconductor device 50, and other components of the packaged semiconductor device are placed within the cavity and the mold closed therearound. If offsets 36 have not been adequately trimmed, as mold 70 is closed on leadframe 30, the offsets will flex toward or bend in a predictable direction, as illustrated by the arrows that are adjacent the offsets. Thus, the non-perpendicular angle of extension of offsets 36 reduces the amount of force that each offset 36 will apply to inner surface 73 of cavity 72 as mold halves 70*a* and 70*b* are forced together, thereby reducing or eliminating damage to the inner surface 73 of cavity 72 that may be caused by offsets 36.

Offsets 36 that extend from major plane 38 of leadframe 30 at an angle of about 45 degrees or less to the major plane are further desirable since existing leadframe fabrication equipment can accurately bend the offsets to such an angle. Consequently, the fabrication costs of the leadframe of the present invention are not significantly increased relative to the costs of fabricating conventional leadframes.

FIG. 8 illustrates a packaged semiconductor device 60 of the present invention, which includes a semiconductor device 50, leads 34 operatively connected to the semiconductor device, offsets 36 that extend transversely and non-perpendicularly from a major plane 38 of the leads, and a package 62 that covers, or encapsulates, at least a portion of each of the leads and the semiconductor device. Package 62 is formed of a packaging material 76, or encapsulant. Offsets 36 extend through package 62 to a position that is proximate the exterior of the package. Offsets 36 may extend to a position that is flush with the exterior surface of package 62, such that an edge of an end of one or more of the offsets is exposed to the exterior of the package.

Referring again to FIG. 2, the non-perpendicular angle at which offsets 36 extend from major plane 38 enhances the mechanical reliability of the packaged semiconductor device 60 (FIG. 8). Such non-perpendicular extension of offsets 36 provides enhanced mechanical reliability over conventional leads that lack offsets by reducing the amount that a packaged semiconductor device may bow, warp, bend, skew, or otherwise distort as the packaged semiconductor device undergoes a temperature change or is subjected to high temperatures, such as the ambient operating temperature of the semiconductor device 50 contained therein.

Figure 9:
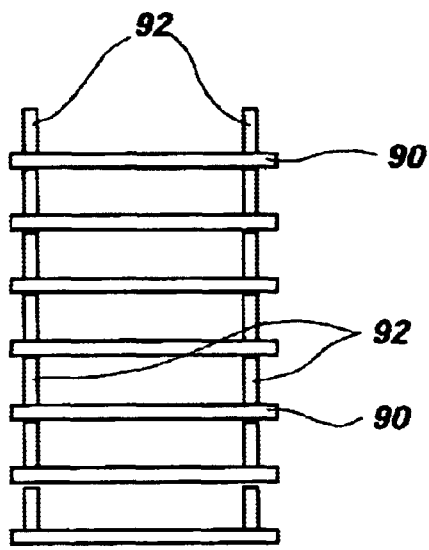
FIG. 9 is a schematic representation of a plurality of conventional leadframes including perpendicularly extending offsets that are stacked one upon another.
Figure 10:
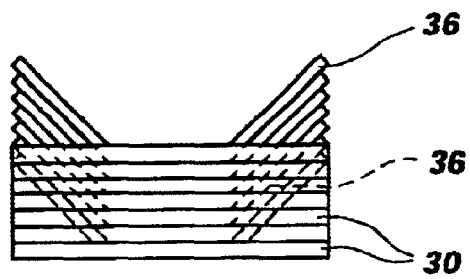
FIG. 10 is a schematic representation of a plurality of the leadframes of FIG. 5, which includes offsets that extend therefrom at an angle of about 45 degrees or less, in a stacked orientation.

The non-perpendicular extension of offsets 36 from leadframe 30 also provides advantages over conventional leads that include perpendicularly extending offsets. The inventive leadframe consumes less space during storage than leadframes which include perpendicularly extending offsets. As illustrated in FIG. 9, when stacked one upon another, adjacent conventional leadframes 90 that include substantially perpendicularly extending offsets 92 are spaced apart from one another. In contrast, as shown in FIG. 10, leadframes 30, which include non-perpendicularly extending offsets 36, may be compactly stacked, such that the adjacent surfaces of leadframes 30 are in substantial contact with each other.

Figure 11:
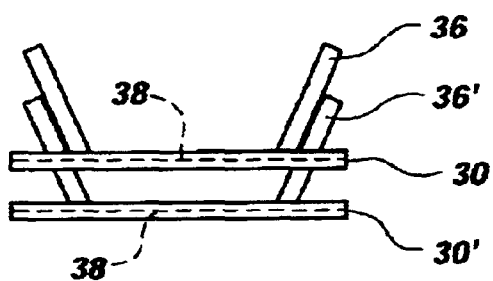
FIG. 11 is a schematic representation of two adjacent, stacked leadframes which include offsets that extend therefrom at a non-perpendicular angle of greater than about 45 degrees.

As shown in FIG. 11, an offset 36 having an angle of extension of greater than about 45 degrees from the major plane 38 of the leadframe 30 may exert force on a corresponding offset 36' of an adjacent leadframe 30', causing one or both of the leadframes to bow. Accordingly, an offset 36 angle of extension of about 45 degrees or less facilitates optimally compact stacking of leadframes 30 against one another, while reducing or eliminating any bowing of the leadframes that may occur during stacking thereof.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method for designing a leadframe, comprising:

configuring a plurality of leads to be at least partially located within a major plane of the leadframe; and configuring at least one offset for locational contact with a surface of processing equipment during processing of at least the leadframe to extend non-perpendicularly from said major plane, said at least one offset not comprising a lead.

2. The method of claim 1, wherein said configuring said at least one offset comprises configuring said at least one offset to extend from a first side of said major plane.

3. The method of claim 2, wherein said configuring said at least one offset comprises configuring at least another offset to extend from a second side of said major plane.

4. The method of claim 1, wherein said configuring said at least one offset comprises configuring said at least one offset from a configured die mounting region of the leadframe.

5. The method of claim 1, wherein said configuring said at least one offset comprises configuring said at least one offset to extend at an angle of about 45 degrees or less from said major plane.

6. The method of claim 1, wherein said configuring said at least one offset comprises configuring said at least one offset to extend from the leadframe adjacent at least one of said plurality of leads.

7. The method of claim 1, wherein said configuring said at least one offset comprises configuring said at least one offset for resilient locational contact with a surface of said processing equipment.

8. A method for fabricating a leadframe, comprising:

providing a sheet comprising electrically conductive material;

forming a frame from said sheet;

forming a plurality of leads from said sheet, each of said plurality of leads extending from said frame; and forming at least one offset for locational contact with a surface of processing equipment during processing of at least the leadframe to extend non-perpendicularly from a major plane of said frame, said at least one offset not comprising a lead.

9. The method of claim 8, further comprising forming a tie bar to interconnect selected ones of said plurality of leads to each other.

10. The method of claim 8, further comprising forming a die mounting region proximate die connect ends of at least some of said plurality of leads.

11. The method of claim 10, wherein said forming said at least one offset comprises forming said at least one offset from said die mounting region.

12. The method of claim 8, wherein said forming said at least one offset comprises forming at least two offsets that extend away from said major plane in different directions.

13. The method of claim 8, wherein said forming said at least one offset comprises forming at least two offsets that extend from opposite sides of said major plane.

14. The method of claim 8, wherein said forming said at least one offset comprises forming said at least one offset for resilient locational contact with a surface of said processing equipment.

15. A method for manufacturing a leadframe, comprising:

forming a frame from a sheet comprising electrically conductive material;

forming a plurality of leads from said sheet, each of said plurality of leads extending from said frame and being located at least partially within a major plane thereof; and forming at least one offset for locational contact of the leadframe with a surface of processing equipment during processing of at least the leadframe to extend nonperpendicularly from said major plane of said sheet, said at least one offset not comprising a lead.

16. The method of claim 15, further comprising forming a tie bar to interconnect at least some of said plurality of leads.

17. The method of claim 15, further comprising forming a die mounting region proximate die connect ends of at least some of said plurality of leads.

18. The method of claim 17, wherein said forming said at least one offset comprises forming said at least one offset to extend from said die mounting region.

19. The method of claim 15, wherein said forming said at least one offset comprises forming at least two offsets to extend from said major plane in different directions.

20. The method of claim 15, wherein said forming said at least one offset comprises forming at least two offsets to extend from opposite sides of said major plane.

21. The method of claim 15, wherein said forming said at least one offset comprises forming said at least one offset for resilient locational contact with a surface of said processing equipment.

* * * * *